(12) United States Patent
Chemama et al.

(10) Patent No.: US 11,921,063 B2
(45) Date of Patent: Mar. 5, 2024

(54) LATERAL RECESS MEASUREMENT IN A SEMICONDUCTOR SPECIMEN

(71) Applicant: Applied Materials Israel Ltd., Rehovot (IL)

(72) Inventors: Michael Chemama, Rehovot (IL); Ron Meiry, Givatayim (IL); Moshe Eliasof, Givatayim (IL); Lior Yaron, Nes Ziona (IL); Guy Eytan, Kidron (IL); Konstantin Chirko, Rehovot (IL); Rafael Bistritzer, Petach Tikva (IL)

(73) Assignee: Applied Materials Israel Ltd., Rehovot (IL)

( * ) Notice: Subject to any disclaimer, the term of this patent is extended or adjusted under 35 U.S.C. 154(b) by 292 days.

(21) Appl. No.: 17/382,280

(22) Filed: Jul. 21, 2021

(65) Prior Publication Data
US 2023/0023363 A1    Jan. 26, 2023

(51) Int. Cl.
*G01N 23/2206*    (2018.01)
*G01N 23/2251*    (2018.01)
(Continued)

(52) U.S. Cl.
CPC ..... *G01N 23/2206* (2013.01); *G01N 23/2251* (2013.01); *H01J 37/222* (2013.01);
(Continued)

(58) Field of Classification Search
CPC .......... G01N 23/2206; G01N 23/2251; G01N 2223/61; G01N 2223/66; G01N 2223/053; G01N 2223/303; G01N 2223/306; G01N 2223/401; G01N 2223/418; G01N 2223/501; G01N 2223/6116; H01J 37/28; H01J 37/222; H01J 2237/2802;
(Continued)

(56) References Cited

U.S. PATENT DOCUMENTS 9,520,266 B2    12/2016    Shirahata et al.
9,852,881 B2 *   12/2017    Shishido ............... H01J 37/244

OTHER PUBLICATIONS

Nijkerk et al., EP 1619495 A1, "Inspection Method Of Specimen Surface, E.g. Semiconductor Wafer Surface, Involves Converting Secondary Charged Beams Generated From Surface During Primary Beam Radiation Into Optical Beam And Detecting Optical Beam", Date Published: Jan. 25, 2006 (Year: 2006).*

(Continued)

*Primary Examiner* — John H Le
(74) *Attorney, Agent, or Firm* — Lowenstein Sandler LLP

(57) ABSTRACT

There is provided a system and method of measuring a lateral recess in a semiconductor specimen, comprising: obtaining a first image acquired by collecting SEs emitted from the surface of the specimen, and a second image acquired by collecting BSEs scattered from an interior region of the specimen between the surface and a target second layer, the specimen scanned using an electron beam with a landing energy selected to penetrate to a depth corresponding to the target second layer; generating a first GL waveform based on the first image, and a second GL waveform based on the second image; estimating a first width of the first layers based on the first GL waveform, and a second width with respect to at least the target second layer based on the second GL; and measuring a lateral recess based on the first width and the second width.

20 Claims, 7 Drawing Sheets

(51) Int. Cl.
    *H01J 37/22*     (2006.01)
    *H01J 37/28*     (2006.01)
    *H01L 21/66*     (2006.01)

(52) U.S. Cl.
    CPC .............. *H01J 37/28* (2013.01); *H01L 22/20* (2013.01); *G01N 2223/053* (2013.01); *G01N 2223/303* (2013.01); *G01N 2223/306* (2013.01); *G01N 2223/401* (2013.01); *G01N 2223/418* (2013.01); *G01N 2223/501* (2013.01); *G01N 2223/61* (2013.01); *G01N 2223/6116* (2013.01); *G01N 2223/66* (2013.01); *H01J 2237/2802* (2013.01); *H01J 2237/2806* (2013.01); *H01J 2237/2815* (2013.01)

(58) Field of Classification Search
    CPC ...... H01J 2237/2806; H01J 2237/2815; H01L 22/12; H01L 22/20
    USPC ........................................................ 702/172
    See application file for complete search history.

(56) References Cited

OTHER PUBLICATIONS

Sun et al., TW 202042321 A1, "Pattern Measurement Device And Measurement Method", Date Published: Nov. 16, 2020 (Year: 2020).*

\* cited by examiner

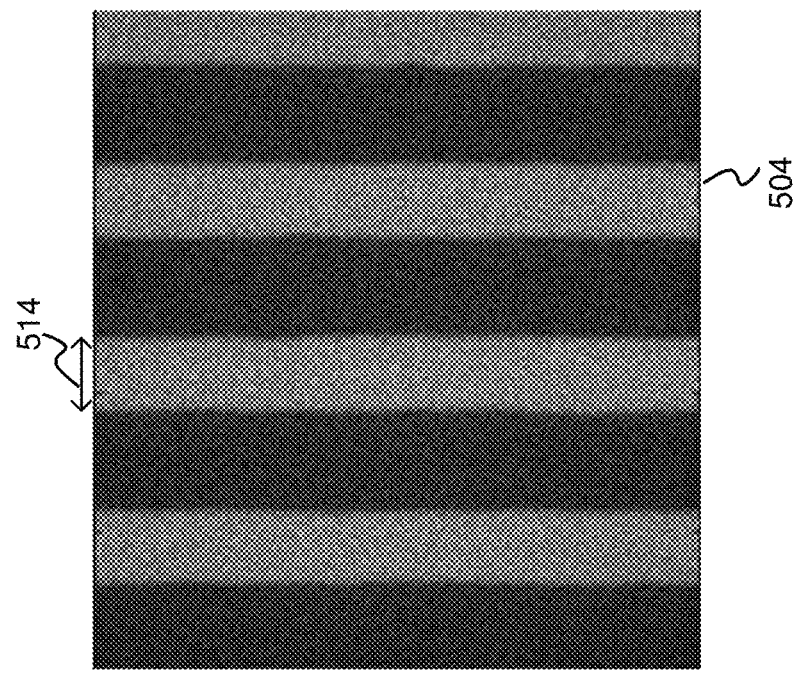
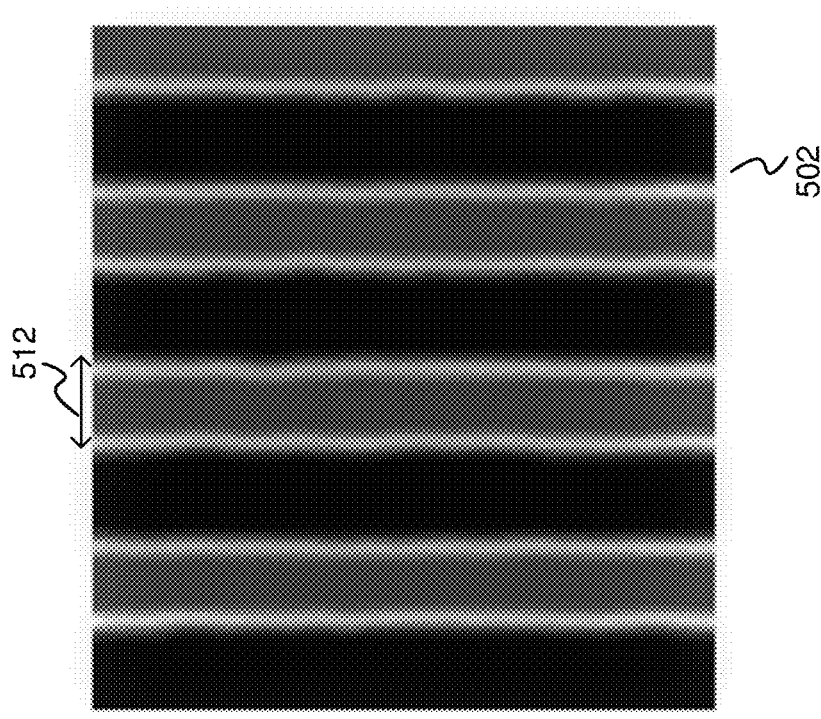
FIG. 5

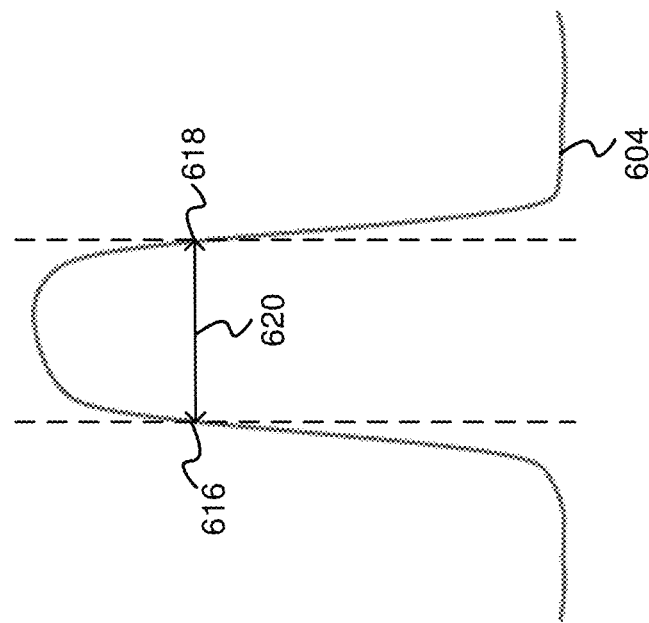
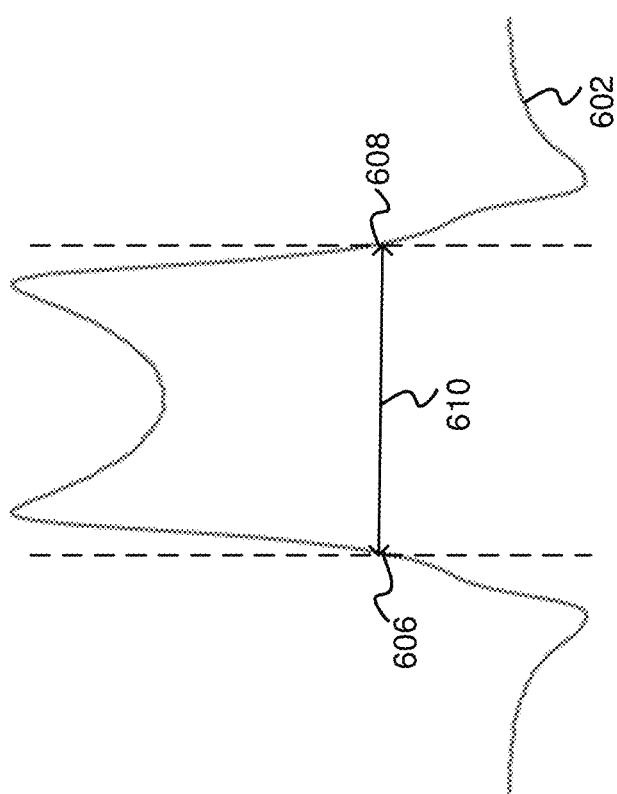
FIG. 6

LATERAL RECESS MEASUREMENT IN A SEMICONDUCTOR SPECIMEN

TECHNICAL FIELD

The presently disclosed subject matter relates, in general, to the field of examination of a semiconductor specimen, and more specifically, to critical dimension (CD) metrology with respect to lateral recess in a specimen.

BACKGROUND

Current demands for high density and performance associated with ultra large-scale integration of fabricated devices require submicron features, increased transistor and circuit speeds, and improved reliability. As semiconductor processes progress, pattern dimensions such as line width, and other types of critical dimensions, are continuously shrunken. Such demands require formation of device features with high precision and uniformity, which, in turn, necessitates careful monitoring of the fabrication process, including automated examination of the devices while they are still in the form of semiconductor wafers.

Examination can be provided by using non-destructive examination tools during or after manufacture of the specimen to be examined. Examination generally involves generating certain output (e.g., images, signals, etc.) for a specimen by directing light or electrons to the wafer and detecting the light or electrons from the wafer. A variety of non-destructive examination tools includes, by way of non-limiting example, scanning electron microscopes, atomic force microscopes, optical inspection tools, etc.

Examination processes can include a plurality of examination steps. During the manufacturing process, the examination steps can be performed a multiplicity of times, for example after the manufacturing or processing of certain layers, or the like. Additionally or alternatively, each examination step can be repeated multiple times, for example for different wafer locations, or for the same wafer locations with different examination settings.

Examination processes are used at various steps during semiconductor fabrication to detect and classify defects on specimens, as well as perform metrology related operations. Effectiveness of examination can be increased by automatization of process(es) as, for example, defect detection, Automatic Defect Classification (ADC), Automatic Defect Review (ADR), automated metrology-related operations, etc.

SUMMARY

In accordance with certain aspects of the presently disclosed subject matter, there is provided a computerized system of measuring a lateral recess in a semiconductor specimen, the semiconductor specimen comprising a stack of a first type of one or more first layers and a second type of one or more second layers deposited alternately on each other, the second layers being at least partially etched thereby forming a lateral recess between each given second layer and two first layers adjacent thereto, the system comprising: an electron beam tool configured to: scan the semiconductor specimen using an electron beam with a landing energy specifically selected to penetrate to a predefined depth corresponding to a target second layer of the specimen; and acquire a first image by collecting secondary electrons (SE) emitted from the surface of the specimen, and acquire a second image by collecting backscattered electrons (BSE) scattered from an interior region of the specimen between the surface and the target second layer, the first image informative of a surface profile of the specimen, the second image informative of interior structure of the interior region; and a processing and memory circuitry (PMC) operatively connected to the electron beam tool and configured to: generate a first gray level (GL) waveform informative of GL intensity distribution of the first image, and a second GL waveform informative of GL intensity distribution of the second image; estimate a first width of the one or more first layers based on the first GL waveform and a second width with respect to at least the target second layer based on the second GL waveform; and measure a lateral recess with respect to the target second layer based on the first width and the second width.

In addition to the above features, the system according to this aspect of the presently disclosed subject matter can comprise one or more of features (i) to (x) listed below, in any desired combination or permutation which is technically possible:

(i). The semiconductor specimen comprises a Gate All Around (GAA) device. The first layers are made of Silicon, and the second layers are made of silicon germanium.

(ii). The target second layer is a top second layer of the one or more second layers, and the measured lateral recess is a top-layer lateral recess formed between the top second layer and the adjacent first layers thereof.

(iii). The target second layer is a subsequent second layer following a top second layer, and the measured lateral recess is an average lateral recess of a top-layer lateral recess formed between the top second layer and the adjacent first layers thereof and a subsequent lateral recess formed between the subsequent second layer and the adjacent first layers thereof.

(iv). The PMC is further configured to measure an average lateral recess with respect to a subsequent second layer following the top second layer, and derive a subsequent-layer lateral recess based on the average lateral recess and the top-layer lateral recess.

(v). The SEs are collected by an array of SE detectors, and the BSEs are collected by at least one BSE detector.

(vi). The landing energy to penetrate to the predefined depth corresponding to the target second layer is specifically selected based on a comparison between the number of BSEs with respect to a reference specimen with no lateral recess and the number of BSEs with respect to a semiconductor specimen of interest.

(vii). The estimating the first width comprises estimating first topo-points on the first GL waveform by calculating derivatives along the first GL waveform, and applying a predefined derivative threshold on the first GL waveform, giving rise to the first topo-points, and measuring the first width between the first topo-points.

(viii). The estimating the second width comprises estimating second topo-points on the second GL waveform by applying a predefined GL threshold on the second GL waveform, giving rise to the second topo-points, and measuring the second width between the second topo-points.

(ix). The PMC is further configured to calibrate the measured lateral recess with respect to reference measurement data obtained from TEM.

(x). The calibration is based on a correlation relationship previously derived between corresponding measurement data from the electron beam tool and the reference measurement data obtained from TEM.

In accordance with other aspects of the presently disclosed subject matter, there is provided a method of measuring a lateral recess in a semiconductor specimen, the semiconductor specimen comprising a stack of a first type of one or more first layers and a second type of one or more second layers deposited alternately on each other, the second layers being at least partially etched, thereby forming a lateral recess between each given second layer and two first layers adjacent thereto, the method performed by a processing and memory circuitry (PMC) and comprising: obtaining a first image acquired by collecting secondary electrons (SE) emitted from surface of the specimen, and a second image acquired by collecting backscattered electrons (BSE) scattered from an interior region of the specimen between the surface and a target second layer, wherein the semiconductor specimen is scanned using an electron beam with a landing energy specifically selected to penetrate to a predefined depth corresponding to the target second layer, and wherein the first image is informative of a surface profile of the specimen, and the second image is informative of interior structure of the interior region; generating a first gray level (GL) waveform informative of GL intensity distribution of the first image, and a second GL waveform informative of GL intensity distribution of the second image; estimating a first width of the first layers based on the first GL waveform and a second width with respect to at least the target second layer based on the second GL; and measuring a lateral recess with respect to the target second layer based on the first width and the second width.

This aspect of the disclosed subject matter can comprise one or more of features (i) to (x) listed above with respect to the system, mutatis mutandis, in any desired combination or permutation which is technically possible.

In accordance with other aspects of the presently disclosed subject matter, there is provided a non-transitory computer readable medium comprising instructions that, when executed by a computer, cause the computer to perform a method of measuring a lateral recess in a semiconductor specimen, the semiconductor specimen comprising a stack of a first type of one or more first layers and a second type of one or more second layers deposited alternately on each other, the second layers being at least partially etched, thereby forming a lateral recess between each given second layer and two first layers adjacent thereto, the method comprising: obtaining a first image acquired by collecting secondary electrons (SE) emitted from surface of the specimen, and a second image acquired by collecting backscattered electrons (BSE) scattered from an interior region of the specimen between the surface and a target second layer, wherein the semiconductor specimen is scanned using an electron beam with a landing energy specifically selected to penetrate to a predefined depth corresponding to the target second layer, and wherein the first image is informative of a surface profile of the specimen, and the second image is informative of the interior structure of the interior region; generating a first gray level (GL) waveform informative of GL intensity distribution of the first image, and a second GL waveform informative of GL intensity distribution of the second image; estimating a first width of the first layers based on the first GL waveform and a second width with respect to at least the target second layer based on the second GL; and measuring a lateral recess with respect to the target second layer based on the first width and the second width.

This aspect of the disclosed subject matter can comprise one or more of features (i) to (x) listed above with respect to the system, mutatis mutandis, in any desired combination or permutation which is technically possible.

BRIEF DESCRIPTION OF THE DRAWINGS

In order to understand the disclosure and to see how it may be carried out in practice, embodiments will now be described, by way of non-limiting example only, with reference to the accompanying drawings, in which:

FIG. 5 illustrates examples of a first image and a second image for GAA structures in accordance with certain embodiments of the presently disclosed subject matter.

FIG. 6 illustrates examples of a first GL waveform and a second GL waveform in accordance with certain embodiments of the presently disclosed subject matter.

DETAILED DESCRIPTION OF EMBODIMENTS

Figure 1:
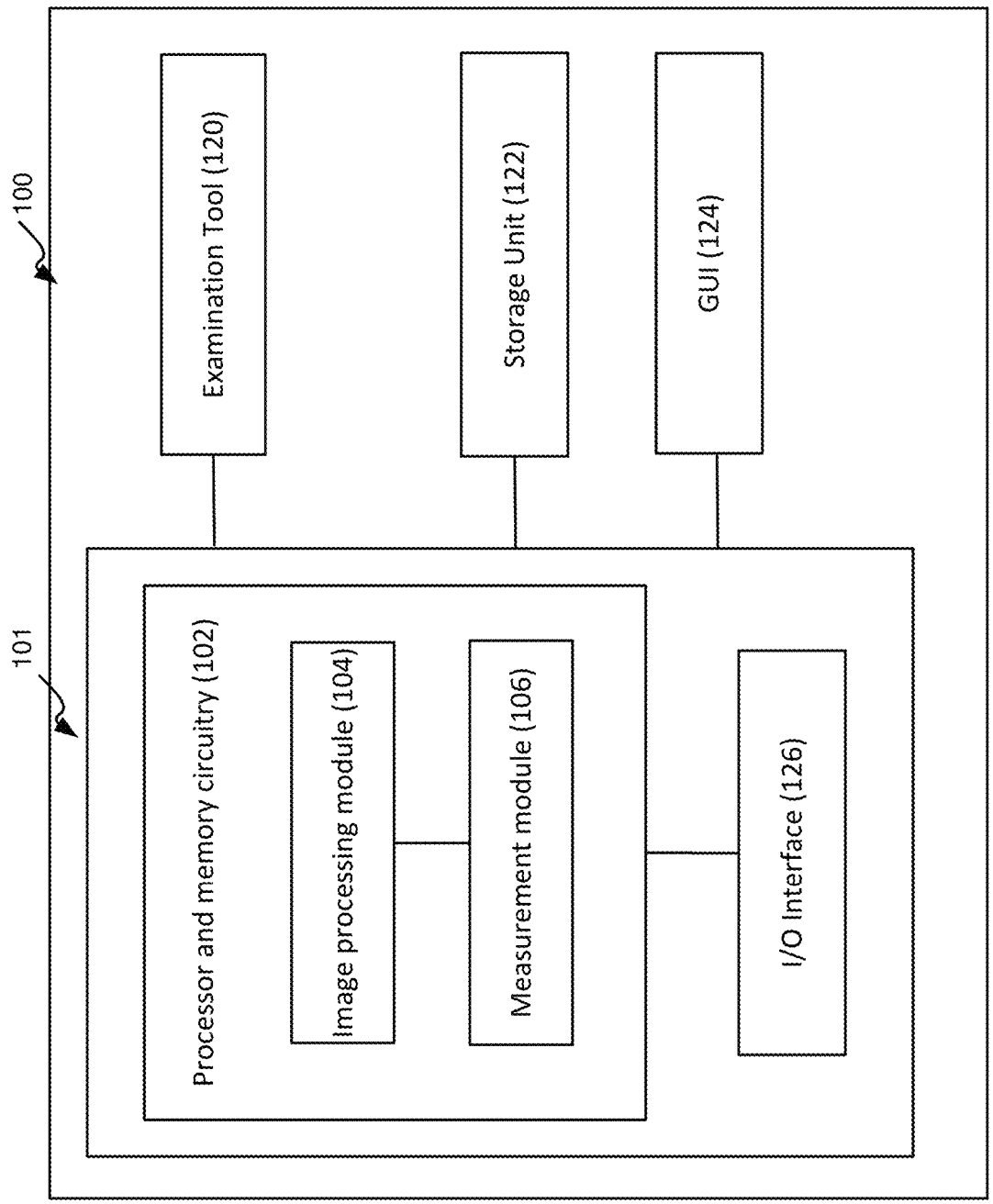
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "measuring", "scanning", "acquiring", "generating", "estimating", "deriving", "selecting", "calculating", "applying", "calibrating", or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the examination system, the metrology system and respective parts thereof disclosed in the present application.

The term "examination" used in this specification should be expansively construed to cover any kind of metrology-related operations, as well as operations related to detection and/or classification of defects in a specimen during its fabrication. Examination is provided by using non-destructive examination tools during or after manufacture of the specimen to be examined. By way of non-limiting example, the examination process can include one or more of the following operations: runtime scanning (in a single or in multiple scans), sampling, reviewing, measuring, classifying and/or other operations provided with regard to the specimen or parts thereof, using the same or different examination tools. Likewise, examination can be provided prior to manufacture of the specimen to be examined, and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

The term "metrology" used in this specification should be expansively construed to cover any kind of measuring characteristics and features in a specimen provided by using examination and/or metrology tools during or after manufacture of the specimen to be inspected. By way of non-limiting example, the metrology process can include generating a measurement recipe and/or performing runtime measurement, for example by scanning (in a single or in multiple scans), reviewing, measuring and/or other operations provided with regard to the specimen or parts thereof using the same or different tools. Measurement results such as measured images are analyzed for example, by employing image-processing techniques. Note that, unless specifically stated otherwise, the term "metrology" or derivatives thereof used in this specification are not limited with respect to measurement technology, measurement resolution or size of inspection area.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "defect" used in this specification should be expansively construed to cover any kind of abnormality or undesirable feature formed on or within a specimen.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter.

The examination system 100 illustrated in FIG. 1 can be used for examination of a semiconductor specimen (e.g., of a wafer and/or parts thereof) as part of the specimen fabrication process. As described above, the examination referred to herein can be construed to cover any kind of metrology-related operations, as well as operations related to detection and/or classification of defects in a specimen during its fabrication. According to certain embodiments of the presently disclosed subject matter, the illustrated examination system 100 comprises a computer-based system 101 capable of automatically performing one or more metrology operations on images obtained during specimen fabrication. System 101 is also referred to as a metrology system, which is a sub-system of the examination system 100. Specifically, according to certain embodiments, the metrology operations can include critical dimension (CD) measurements with respect to a lateral recess formed in a semiconductor specimen.

System 101 can be operatively connected to one or more examination tools 120 configured to scan a semiconductor specimen and capture images thereof for examination of the specimen. In some embodiments, at least one of the examination tools 120 has metrology capabilities and can be configured to perform metrology operations on the captured images. Such an examination tool is also referred to as a metrology tool.

The term "metrology operation" used in this specification should be expansively construed to cover any metrology operation procedure used to extract metrology information relating to one or more structural elements on a semiconductor specimen. By way of example, metrology information to be extracted can be indicative of one or more of the following: dimensions (e.g., line widths, line spacing, contact diameters, size of the element, edge roughness, gray level statistics, etc.), shapes of elements, distances within or between elements, related angles, overlay information associated with elements corresponding to different design levels, etc. In some embodiments, the metrology operations can include measurement operations, such as, e.g., CD measurements performed with respect to certain structures on the specimen.

The term "examination tool(s)" used herein should be expansively construed to cover any tools that can be used in examination-related processes, including, by way of non-limiting example, imaging, scanning (in a single or in multiple scans), sampling, reviewing, measuring, classifying and/or other processes provided with regard to the specimen or parts thereof.

By way of example, a specimen can be examined by one or more low-resolution examination tools (e.g., an optical inspection system, low-resolution SEM, etc.). The resulting data (referred to as low-resolution image data), informative of low-resolution images of the specimen, can be transmitted—directly or via one or more intermediate systems—to system 101. Alternatively, or additionally, the specimen can be examined by a high-resolution tool (e.g., a Scanning Electron Microscope (SEM) or Atomic Force Microscopy (AFM) or Transmission Electron Microscope (TEM)). The resulting data (referred to as high-resolution image data), informative of high-resolution images of the specimen, can be transmitted—directly or via one or more intermediate systems—to system 101.

Without limiting the scope of the disclosure in any way, it should also be noted that the examination tools 120 can be implemented as examination machines of various types, such as optical imaging machines, electron beam machines, and so on. In some cases, the same examination tool can provide low-resolution image data and high-resolution image data.

According to certain embodiments, one of the examination tools is an electron beam tool, such as, e.g., scanning electron microscopy (SEM). SEM is a type of electron microscope that produces images of a specimen by scanning the specimen with a focused beam of electrons. The electrons interact with atoms in the specimen, producing various signals that contain information on the surface topography and/or composition of the specimen. The position of the beam is combined with the intensity of the detected signal to produce an image. SEM is capable of accurately measuring features during the manufacture of semiconductor wafers. By way of example, the SEM tool can be critical dimension scanning electron microscopes (CD-SEM) used to measure critical dimensions of structural features in the images.

System 101 includes a processor and memory circuitry (PMC) 102 operatively connected to a hardware-based I/O interface 126. PMC 102 is configured to provide processing necessary for operating the system, as further detailed with reference to FIGS. 2A, 2B and 3, and comprises a processor (not shown separately) and a memory (not shown separately). The processor of PMC 102 can be configured to execute several functional modules in accordance with computer-readable instructions implemented on a non-transitory computer-readable memory comprised in the PMC. Such functional modules are referred to hereinafter as comprised in the PMC.

As aforementioned, in some embodiments, system 101 can be configured to measure a lateral recess in a semiconductor specimen. Lateral recess, also termed as cavity recess, refers to a recess formed from lateral sides of a semiconductor specimen. Specifically, in some embodiments, the semiconductor specimen can comprise a stack of two types of layers: a first type of one or more first layers and a second type of one or more second layers deposited alternately on each other, forming a superlattice layer stack. The two types of layers can be made of different materials. During the fabrication process, there may be a need to selectively recess only one material type out of the superlattice layer stack. For instance, the second layers can be at least partially etched, thereby forming a lateral recess between each given second layer and two first layers adjacent to the given second layer. In some cases, it is of the specimen manufacturer's particular interest to measure the lateral recess (e.g., the width of the lateral recess, also referred to as cavity depth) which is rendered as one of the geometrical parameters having a strong impact on the final device performance. It can also provide an indication of the etching progress, as well as facilitating fine-tuning and control of the fabrication process.

This recess, as is etched from the lateral sides of the specimen, is hidden and buried in the stack, thus cannot be seen from the top-down images, as normally taken by the examination tools. Current process control relies either on costly, slow and destructive cross-sectional electron microscopy, such as using a metrology tool like TEM, or optical inspection technologies, such as optical critical dimension (OCD) scatterometry, which rely on specific light spectrums and provide indirect and less accurate measurements.

The semiconductor specimen that may comprise a layer stack structure as described above can be either logic or memory devices. By way of example, the specimen can be a logic device such as, e.g., a gate-all-around field-effect transistor (GAAFET), also referred to herein as a gate-all-around (GAA) device or transistor. By way of another example, the specimen can be a memory device such as, e.g., 3D NAND (NOT-AND), which is a type of non-volatile flash memory where the memory cells are stacked vertically in multiple layers. By way of further example, the specimen can be a memory device such as, e.g., 3D Storage Class Memory (3D SCM).

For exemplary and illustrative purposes, certain embodiments of the presently disclosed subject matter herein are described with respect to a GAA device. This is by no means intended to limit the present disclosure in any way. It is appreciated that the proposed methods and systems can be applied to lateral recess measurement in other semiconductor specimens having similar structures as described above.

Figure 4:
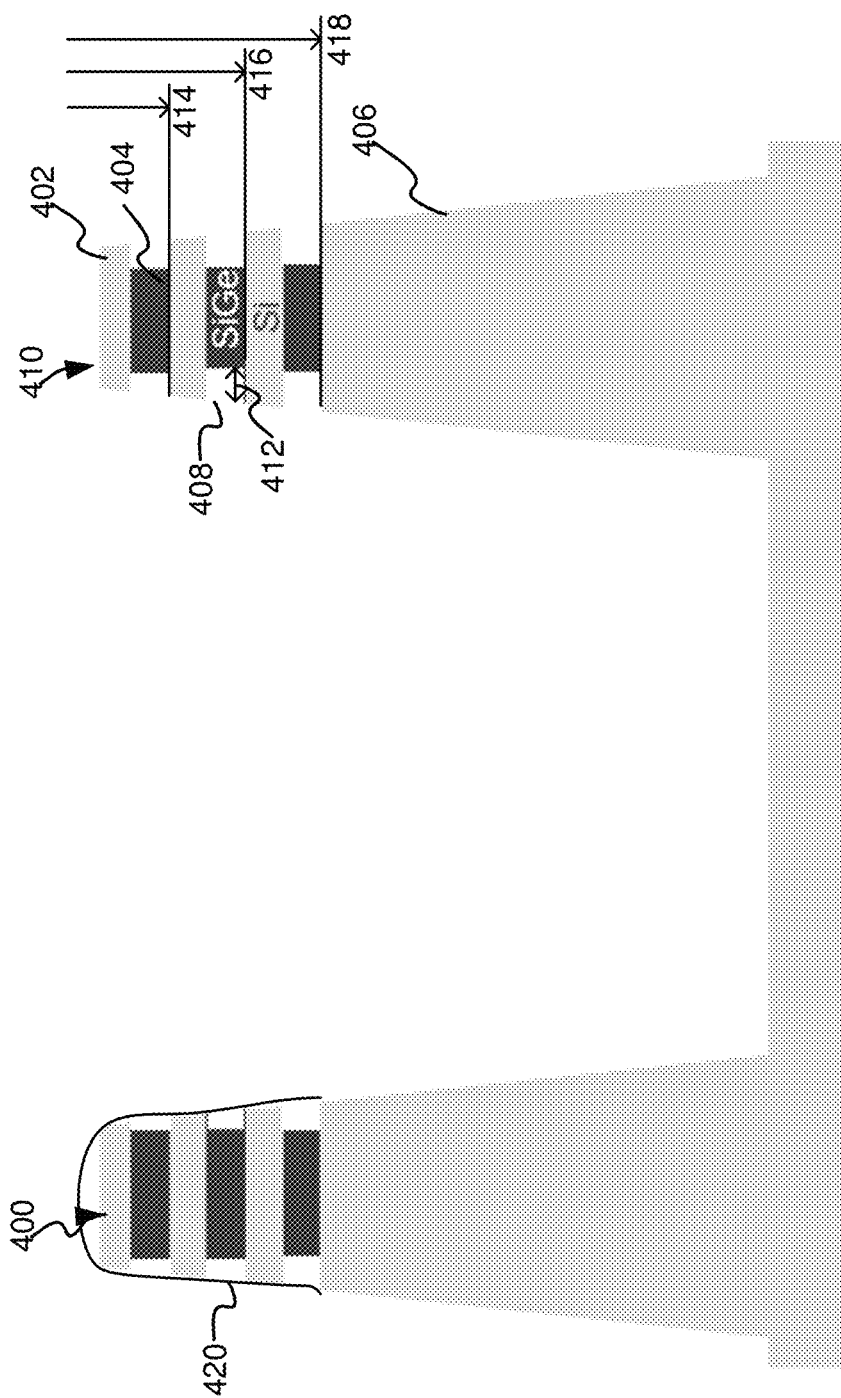
FIG. 4 illustrates a schematic illustration of GAA structure in accordance with certain embodiments of the presently disclosed subject matter.

A GAA device is a field-effect transistor where the gate material surrounds the channel region on all sides, such as, e.g., Nanosheet (NS), Forksheet (FS), and Complementary field-effect (CFET) transistors, etc. FIG. 4 shows a schematic illustration of GAA structure in accordance with certain embodiments of the presently disclosed subject matter.

A GAA structure 410 comprises a stack of two types of layers: a plurality of first layers 402 (i.e., silicon layers) and a plurality of second layers 404 (i.e., silicon germanium layers, also referred to as SiGe layers) formed on a semiconductor substrate 406. The stacked structure comprises a periodic arrangement of a silicon layer deposited on a silicon germanium layer, forming a superlattice layer stack. A plurality of such stacked structures can be formed on a wafer spaced apart from each other, such as the two exemplified GAA structures 400 and 410 formed on the substrate 406 illustrated in FIG. 4. Once the layers are fully grown, a specific chemical is used which selectively etches silicon germanium, but does not act on silicon. Lateral sides of the plurality of silicon germanium layers are etched to remove at least portions of these layers. The etching process can be gradual, and, eventually, only the silicon layers are left suspended as bridges between the source and drain.

During the etching process, a lateral recess is formed between each given second layer and the two first layers adjacent to the given second layer. For instance, a lateral recess or cavity recess 408 is formed between the second silicon germanium layer and the adjacent silicon layers thereof. As described above, in some cases, it is of particular importance to measure the lateral recess (e.g., the width 412 of the lateral recess, which is also referred to as the depth of the cavity) which has strong impact on the final device performance. For exemplified purposes, the GAA structures 400 and 410 are illustrated with different widths of lateral recess to demonstrate what happens to the GAA devices at different etching time points during the etching process.

According to certain embodiments, there is proposed anew way of measuring the lateral recess in the above-described semiconductor specimen using the see-through capabilities of electron beam tools with relatively high-voltage landing energy. The proposed measurement method is not destructive and provides direct measurements with improved accuracy and throughput (TpT).

In some embodiments, the examination tool 120 can be an electron beam tool (e.g., SEM) configured to scan the semiconductor specimen using an electron beam with a landing energy specifically selected to penetrate to a pre-defined depth corresponding to a target second layer of the specimen. The electron beam tool is further configured to acquire a first image by collecting secondary electrons (SE) emitted from the surface of the specimen, and acquire a second image by collecting backscattered electrons (BSE) scattered from an interior region of the specimen between the surface and a target second layer. The first image is informative of a surface profile of the specimen, and the second image is informative of the interior structure of the interior region.

The functional modules comprised in PMC 102 can include an image processing module 104 and a measurement module 106. The PMC 102 can be configured to obtain, via I/O interface 126, the first image and the second image acquired by the electron beam tool. The image processing module 104 can be configured to generate a first gray level (GL) waveform informative of GL intensity distribution of the first image, and generate a second GL waveform informative of GL intensity distribution of the second image. The measurement module 106 can be configured to estimate a first width of the one or more first layers based on the first GL waveform, and estimate a second width with respect to at least the target second layer based on the second GL waveform. The measurement module 106 can be further configured to measure a lateral recess with respect to the target second layer based on the first width and the second width.

Operations of systems 100, 101, PMC 102 and the functional modules therein, will be further detailed with reference to FIGS. 2A, 2B and 3.

According to certain embodiments, system 101 can comprise a storage unit 122. The storage unit 122 can be configured to store any data necessary for operating systems 100 and 101, e.g., data related to input and output of systems 100 and 101, as well as intermediate processing results generated by system 101. By way of example, the storage unit 122 can be configured to store the images (e.g., the first image and the second image) produced by the examination tool 120 and/or derivatives thereof. Accordingly, the images can be retrieved from the storage unit 122 and provided to the PMC 102 for further processing.

In some embodiments, system 101 can optionally comprise a computer-based Graphical User Interface (GUI) 124 which is configured to enable user-specified inputs related to system 101. For instance, the user can be presented with a visual representation of the specimen (for example, by a display forming part of GUI 124), including images of the specimen and/or corresponding waveforms thereof. The user may be provided, through the GUI, with options of defining certain operation parameters. In some cases, the user may also view operation results, such as the lateral recess measurement, and/or further examination results, on the GUI.

As described above, system 101 is configured to receive, via I/O interface 126, images of the specimen. The images can include image data (and/or derivatives thereof) produced by the examination tools 120 and/or image data stored in the storage unit 122 or one or more data depositories. In some cases, image data can refer to images captured by the examination tools during the manufacturing process, and/or pre-processed images derived from the captured images as obtained by various pre-processing stages, etc. It is noted that in some cases the images can include associated numeric data (e.g., metadata, hand-crafted attributes, etc.). It is further noted that certain image data can include data related to a layer of interest and/or data related to one or more additional layers of the specimen.

System 101 is further configured to process the received images and send, via I/O interface 126, the results (e.g., the CD measurements on the image) to the storage unit 122, and/or the examination tool 120.

In some embodiments, additionally to the examination tool 120, the examination system 100 can comprise one or more examination modules, such as, e.g., defect detection module and/or Automatic Defect Review Module (ADR) and/or Automatic Defect Classification Module (ADC) and/or a metrology-related module and/or other examination modules which are usable for examination of a semiconductor specimen. The one or more examination modules can be implemented as stand-alone computers, or their functionalities (or at least part thereof) can be integrated with the examination tool 120. In some embodiments, the measurement as obtained from system 101 can be used by the examination tool 120 and/or the one or more examination modules (or part thereof) for further examination of the specimen.

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules as comprised in the PMC 102 can be distributed over several local and/or remote devices, and can be linked through a communication network. It is further noted that in other embodiments at least some of the examination tool(s) 120, storage unit 122 and/or GUI 124 can be external to the examination system 100 and operate in data communication with system 101 via I/O interface 126. System 101 can be implemented as stand-alone computer(s) to be used in conjunction with the examination tools. Alternatively, the respective functions of the system 101 can, at least partly, be integrated with one or more examination tools 120, thereby facilitating and enhancing the functionalities of the examination tools 120 in examination-related processes.

Figure 2A:
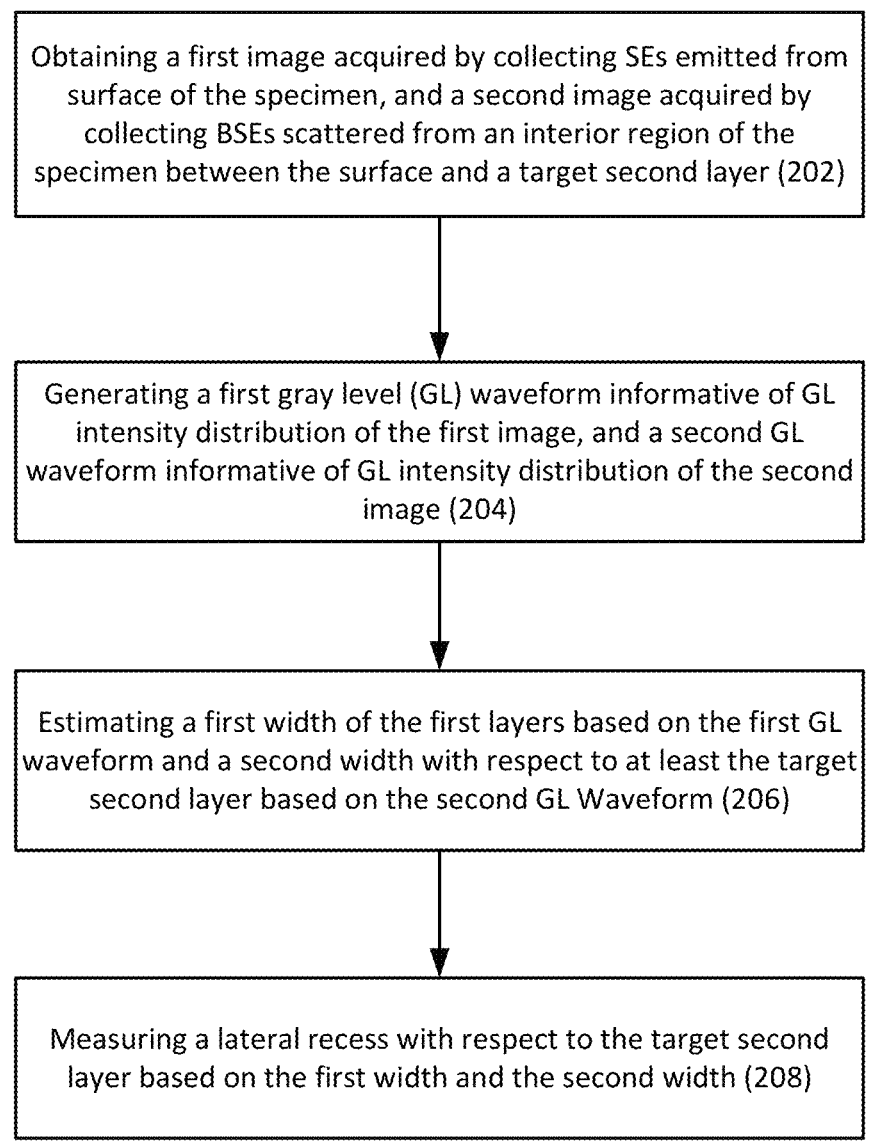
FIG. 2A illustrates a generalized flowchart of measuring a lateral recess in a semiconductor specimen in accordance with certain embodiments of the presently disclosed subject matter.
Figure 2B:
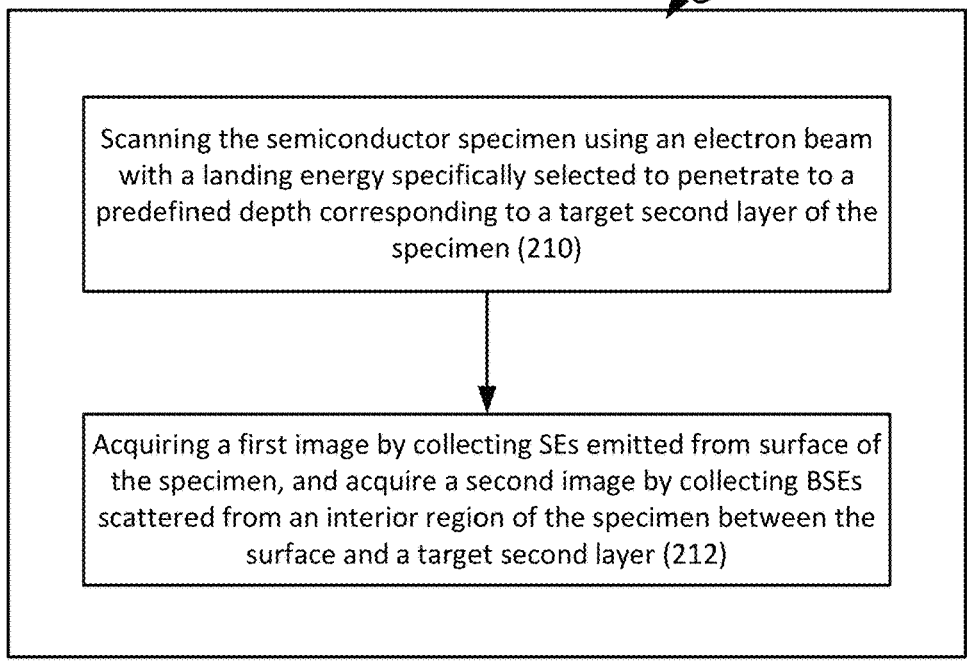
FIG. 2B illustrates a generalized flowchart of acquiring the first image and the second image in accordance with certain embodiments of the presently disclosed subject matter.

Referring now to FIG. 2A, there is illustrated a generalized flowchart of measuring a lateral recess in a semiconductor specimen in accordance with certain embodiments of the presently disclosed subject matter.

As described above, the lateral recess is measured with respect to a semiconductor specimen having a specific type of structure. By way of example, the specimen can comprise a stack of a first type of one or more first layers, and a second type of one or more second layers. The first layers and the second layers are deposited alternately on each other. The second layers are at least partially etched during the fabrication process, thereby forming a lateral recess between each given second layer and two first layers adjacent thereto.

This type of specimen can be either a logic device, such as a GAA device, or a memory device, such as, e.g., 3D NAND, 3D SCM, etc. As an example of such a specifically structured specimen, a GAA device is schematically illustrated in FIG. 4, as described above.

A first image and a second image of the specimen can be obtained (202) (e.g., by the PMC 102 via I/O interface 126, from the examination tool(s) 120 or from the storage unit 122). The first and second images can be acquired by an electron beam tool, such as SEM. For instance, the SEM tool used herein can be critical dimension scanning electron microscopes (CD-SEM) configured to measure critical dimensions of structural elements/features of a specimen based on the captured images. According to certain embodiments, the specimen can be scanned (210) (e.g., by an electron beam tool 120) using an electron beam with a landing energy specifically selected to penetrate to a predefined depth corresponding to a target second layer of the specimen, as illustrated in FIG. 2B, where a generalized flowchart of acquiring the first image and the second image in accordance with certain embodiments of the presently disclosed subject matter is shown.

In a SEM, when an electron beam strikes a specimen, different types of signals are generated. Secondary electrons (SEs) originate from the surface or the near-surface regions of the specimen. They are a result of inelastic interactions between the primary electron beam and the specimen, and have lower energy than the backscattered electrons. Specifically, SEs are produced when an incident electron excites an electron in the specimen and loses some of its energy in the process. The excited electron moves towards the surface of the specimen and, if it still has sufficient energy, it escapes from the surface as a secondary electron. The shallow depth of production of detected SEs makes them ideal for examining topography of the specimen's surface.

Alternatively, backscattered electrons (BSEs) are reflected back after elastic interactions between the beam and the specimen. This type of electrons originates from a broad region within the interaction volume. They are a result of elastic collisions of electrons with atoms, which result in a change in the electrons' trajectory. Specifically, when the electron beam strikes the specimen, some of the electrons are deflected from their original path by atoms in the specimen in an elastic fashion (no loss of energy). These essentially elastically scattered primary electrons (which are high-energy electrons) that rebound from the sample, are referred to as BSEs.

As described, BSEs come from deeper regions of the sample, while SEs originate from surface regions. Therefore, BSEs and SEs carry different types of information. For instance, BSE images show high sensitivity to differences in atomic number, therefore can carry information on the specimen's interior structure and/or composition (i.e., this is referred to as the see-through ability of the BSEs to probe the specimen in depth when provided with enough landing energy), whereas SE images can provide more detailed surface information.

According to certain embodiments of the presently disclosed subject matter, the first image as described above can be acquired (212) (e.g., by an array of SE detectors of the electron beam tool 120) by collecting secondary electrons (SE) emitted from the surface of the specimen. It is to be noted that the surface of the specimen may refer to the outer surface of the specimen facing and exposed to the electron beam, or a surface region of the specimen which may range from the outer surface to a near-surface depth. The first image is thus also referred to herein as the SE image. The second image as described above can be acquired (e.g., by at least one BSE detector of the electron beam tool 120) by collecting backscattered electrons (BSE) scattered from an interior region of the specimen between the surface and the target second layer. The second image is thus also referred to herein as the BSE image. Accordingly, the first image can be informative of a surface profile (e.g., the surface topography) of the specimen, and the second image can be informative of interior structure (and/or composition) of the interior region of the specimen.

As illustrated in FIG. 4, the specimen may comprise multiple first layers and multiple second layers alternately deposited on each other. By way of example, the GAA structure 410 comprises three first layers 402 (i.e., silicon layers) and three second layers 404 (i.e., silicon germanium layers), therefore forming three lateral recesses on each lateral side of the structure, each lateral recess corresponding to the respective cavity formed between a respective second layer and two first layers adjacent thereto. For instance, the lateral recess 408 as illustrated is the second lateral recess out of the three, which is formed between the middle second layer (i.e., the second silicon germanium layer) and the top and bottom first layers adjacent to the middle second layer.

According to certain embodiments, a lateral recess with respect to a target second layer can be measured, by using an electron beam with a landing energy specifically selected to penetrate to a predefined depth corresponding to the target second layer. Specifically, the presently proposed method can be used to measure an average recess of the specimen (i.e., an average recess of multiple lateral recesses comprised in the specimen), and/or a specific per-layer lateral recess (a lateral recess pertaining to the specific target second layer, such as, e.g., the top second layer, the middle second layer, etc.), as will be described in further detail below.

By way of example, in order to measure the specific lateral recess pertaining to the top second layer 404, the landing energy of the electron beam can be specifically selected to penetrate to a predefined depth 414 corresponding to the top second layer 404 (or proximity thereof). For instance, the landing energy is selected to penetrate to the depth corresponding to the bottom (or proximity thereof) of the target second layer (e.g., the top second layer in the present example), as illustrated in FIG. 4. In such cases, the lateral recess as measured is a per-layer lateral recess, i.e., a top-layer lateral recess pertaining to the top second layer.

By way of another example, in order to measure an average lateral recess with respect to the middle second layer, the landing energy of the electron beam can be specifically selected to penetrate to a predefined depth 416 corresponding to the middle second layer (or proximity thereof). In such cases, the lateral recess as measured is an average lateral recess averaged between the top-layer lateral recess and the middle-layer lateral recess. Similarly, when setting the landing energy of the electron beam to be able to penetrate to a predefined depth 418 corresponding to the bottom second layer, the lateral recess as measured is an average lateral recess averaged among the three per-layer lateral recesses: the top-layer lateral recess, the middle-layer lateral recess, and the bottom-layer lateral recess.

In some embodiments, it is possible to first set the landing energy of the electron beam to a penetration depth suitable for measuring the top-layer lateral recess, as described above, and upon the measurement being complete, re-set the landing energy of the electron beam to a penetration depth suitable for measuring the average lateral recess between the top-layer lateral recess and the middle-layer lateral recess. Then the middle-layer lateral recess can be derived based on the two measurements, as will be described in further detail with reference to FIG. 3.

In some embodiments, in order to select the level of landing energy that can penetrate to a specific intended depth corresponding to a target second layer of a specimen to be examined, a reference specimen having similar structure as the specimen, but with no recess formed in any of the second layers, can be simulated and used as a reference. A specimen of interest having lateral recess at a specific second layer can also be simulated. According to certain embodiments, the landing energy to penetrate to the predefined depth corresponding to the target second layer can be specifically selected based on a comparison between the number of BSEs with respect to the reference specimen (with no lateral recess) and the number of BSEs with respect to the specimen of interest (with lateral recess at a specific layer).

Figure 7:
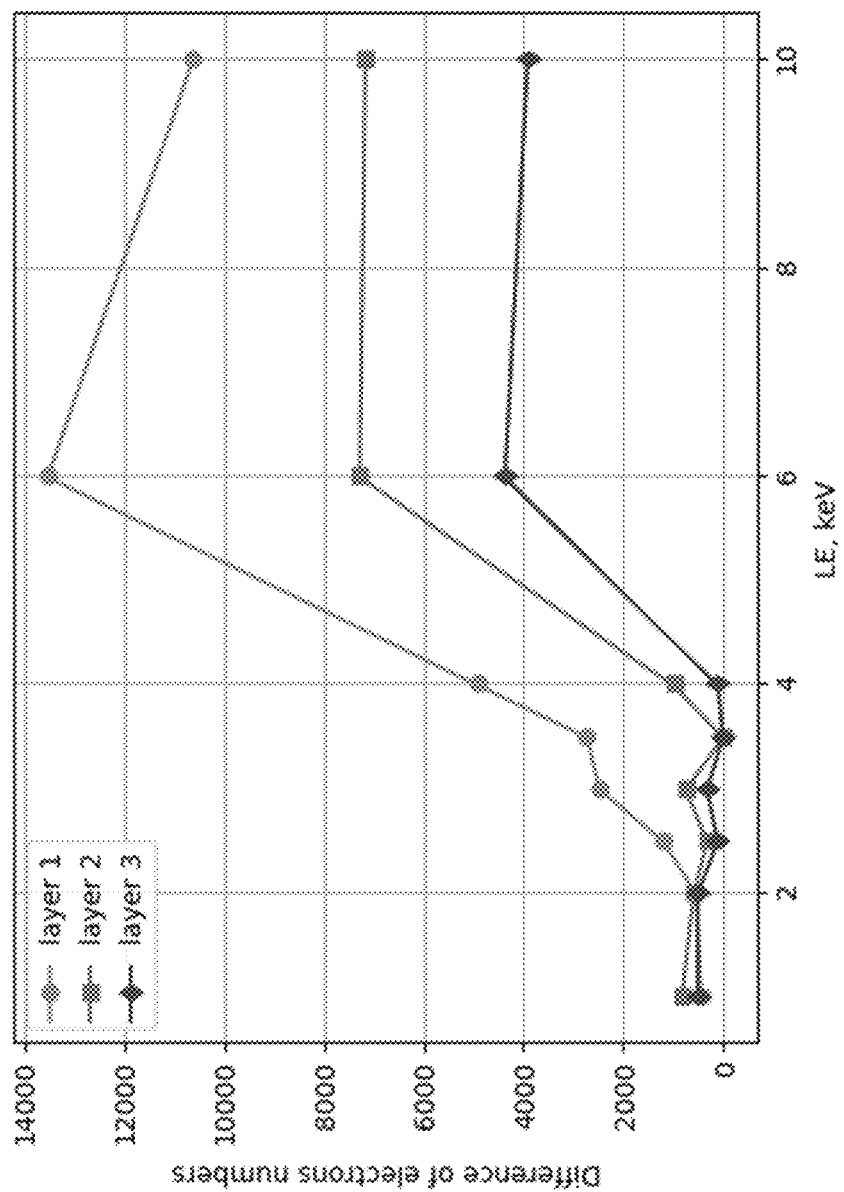
FIG. 7 illustrates an exemplary graph of a correlation between the difference of the number of BSEs received from a reference specimen with respect to the specimen of interest and the level of landing energy used in accordance with certain embodiments of the presently disclosed subject matter.

FIG. 7 illustrates an exemplary graph of a correlation between the difference of the number of BSEs received from a reference specimen with respect to the specimen of interest, and the level of landing energy used in accordance with certain embodiments of the presently disclosed subject matter.

A reference GAA device having similar structure (e.g., having the superlattice stack) as the GAA described with reference to FIG. 4 but with no lateral recess formed in the second layers (SiGe layers), and GAAs of interest having lateral recess respectively at the first, second and third SiGe layers, can be simulated for obtaining the graph. A simulation can be performed to simulate the scanning of the reference GAA and the GAAs of interest respectively, using different landing energies, and the number of BSEs received from both simulated scans can be computed and compared. The graph in FIG. 7 illustrates the difference between the number of BSEs received from both scans (Y axis) with respect to different levels of landing energies used for the scans (X axis), for different second layers of the specimen. For instance, the plot of layer 1 refers to the difference (Y axis) between the number of BSEs received from the scanning of the reference GAA and the scanning of the GAA of interest having lateral recess at the first (i.e., the top) SiGe layer, with respect to different levels of landing energies used for the scans (X axis). The plot of layer 2 refers to the difference (Y axis) between the number of BSEs received from the scanning of the reference GAA and the scanning of the GAA of interest having lateral recess at the second SiGe layer, with respect to different levels of landing energies used for the scans (X axis). The plot of layer 3 refers to the difference (Y axis) between the number of BSEs received from the scanning of the reference GAA and the scanning of the GAA of interest having lateral recess at the third SiGe layer, with respect to different levels of landing energies used for the scans (X axis).

As illustrated, when the landing energy is very low (e.g., less than 2 keV), the difference of the BSEs received from the two scans is close to 0, which means that the landing energy is not high enough to allow the electrons to penetrate to any of the second layers with recess, therefore there is no difference between the number of BSEs received from the two scans. As the landing energy increases, the electrons start to reach the top second layer (e.g., the top SiGe layer) of the specimen, and a difference between the number of BSEs received from the two scans (the scan of the reference GAA and the scan of the GAA of interest having recess at the top SiGe layer) is expected, which indicates the existence of the lateral recess in the top second layer in the GAA of interest with respect to the reference GAA which has no recess at this layer (e.g., less electrons are received from the GAA of interest since there is less material interacting with the electrons and contributing to the scattering thereof due to the recess).

Therefore, in the plot of layer 1, it can be seen that the difference between the number of BSEs received from the two scans keeps increasing when the landing energy increases from approximately 2 keV to 3.5 keV, indicating the electrons with the landing energy in this range are penetrating to the top SiGe layer, while not yet reaching the second and third SiGe layers (as shown, the plots for layer 2 and layer 3 stay close to 0 in this energy range). An electron beam with a landing energy selected approximately in this range can be used to measure a per-layer recess of the top SiGe layer.

As the landing energy continues to increase (e.g., from approximately 3.5 keV to 4.0 keV), the electrons are able to reach the second SiGe layer, where a difference between the number of BSEs received from the two scans (the scan of the reference GAA and the scan of the GAA of interest having a recess at the second SiGe layer) in the plot of layer 2 keeps increasing, as illustrated. An electron beam with a landing energy selected approximately in this range can be used to measure an average recess of the top and second SiGe layers.

When the landing energy increases between 4.0 keV and 6.0 keV, the electrons are able to reach the third SiGe layer, where a difference between the number of BSEs received from the two scans (the scan of the reference GAA and the scan of the GAA of interest having recess at the third SiGe layer) in the plot of layer 3 starts to increase, as illustrated. An electron beam with a landing energy selected approximately in this range can be used to measure an average recess of the top, second and third SiGe layers. At a relatively high landing energy (about 20 keV, not illustrated in FIG. 7), the sensitivity of the electrons to the three different layers is almost the same, indicating that the BSE signal is sensitive only to the average recess over the three layers. Such a relatively high level of landing energy can be used in case of measuring the average recess of the GAA device.

Continuing with the description of FIG. 2A, once the first image and the second images are obtained (as described above with reference to block 202 and FIG. 2B), a first gray level (GL) waveform informative of GL intensity distribution of the first image and a second GL waveform informative of GL intensity distribution of the second image can be generated (204) (e.g., by the image processing module 104 in FIG. 1).

A first width of the one or more first layers can be estimated (206) (e.g., by the measurement module 106 in FIG. 1) based on the first GL waveform. A second width with respect to at least the target second layer can be estimated (206) based on the second GL waveform. A lateral recess with respect to the target second layer can be measured (208) (e.g., by the measurement module 106 in FIG. 1) based on the first width and the second width.

Referring to FIG. 5 now, there are illustrated examples of a first image and a second image for GAA structures in accordance with certain embodiments of the presently disclosed subject matter.

As shown, image 502 is an exemplary first image (i.e., SE image) acquired by collecting SEs emitted from the surface of the specimen, and image 504 is an exemplary second image (i.e., BSE image) acquired by collecting BSEs scattered from an interior region of the specimen between the surface and a target second layer. The first image is informative of a surface profile (e.g., the surface topography) of the specimen. As illustrated, the image 502 presents SE image representation of four GAA structures. For each GAA structure, the gray level intensities vary along the direction perpendicular to the longitudinal axis of the GAA structure, representing changes of the surface profile of the GAA in that direction. For illustrative purposes, a surface profile 420 of a GAA 400 is schematically exemplified in FIG. 4. As shown, the surface profile 420 represents the outer surface topography of the first layers (i.e., the silicon layers) that are exposed to the electron beam during scanning.

As described above, the second image is informative of the interior structure (and/or composition) of the interior region of the specimen between the surface and a target second layer. The image 504 presents BSE image representation of the four GAA structures. For each GAA structure, the variation of the gray level intensities in the BSE image can reflect the hidden lateral recess structure with respect to the remaining portions of the second layers (i.e., the SiGe layers) during the etching process (i.e., the see-through ability of the BSE).

Referring to FIG. 6 now, there are illustrated examples of a first GL waveform and a second GL waveform in accordance with certain embodiments of the presently disclosed subject matter.

As shown, a first GL waveform 602 is generated informative of GL intensity distribution of the first image 502

(e.g., a specific GAA structure thereof), and a second GL waveform 604 is generated informative of GL intensity distribution of the second image 504 in FIG. 5. The first and second GL waveforms are generated along a direction that is perpendicular to a longitudinal axis of the GAA structure.

A first width of the one or more first layers (e.g., the width 512, as exemplified in the SE image of FIG. 5) can be estimated based on the first GL waveform. By way of example, the estimation of the first width can comprise estimating first topo-points on the first GL waveform. A topo-point refers to a point on a signal waveform (e.g., the GL waveform) that is identified to correspond to a specific location on the geometric structure of a specimen. For instance, the first topo-points can be representative of estimated edges/boundaries of the first layers (e.g., representative of the outer boundaries of the widest silicon layer, or average boundaries of the three silicon layers). Specifically, in some embodiments, the first topo-points can be estimated by calculating derivatives along the first GL waveform, applying a predefined derivative threshold on the first GL waveform, giving rise to the first topo-points, and measuring the first width between the first topo-points.

For instance, in the present example of FIG. 6, the two points corresponding to the derivative threshold on the first waveform 602 are identified as 606 and 608. The topo-points 606 and 608 can be representative of the estimated edges/boundaries of the first layers (i.e., silicon layers). The first width 610 between the two points 606 and 608 can be measured, representative of the estimated width 412 of the first layers of a GAA structure.

A second width with respect to at least the target second layer (e.g., the width 514, as exemplified in the BSE image of FIG. 5) can be estimated, based on the second GL waveform. As described above, in cases where the target second layer is the top second layer, the estimated second width refers to the width of the target second layer. In cases where the target second layer is a subsequent second layer following the top second layer, such as, e.g., the middle second layer or the bottom second layer, the estimated second width refers to an average width of the second layers until the target second layer. By way of example, the estimation of the second width can comprise estimating second topo-points on the second GL waveform. For instance, the second topo-points can be representative of estimated edges/boundaries with respect to at least the target second layer. Specifically, in some embodiments, the second topo-points can be estimated by applying a predefined GL threshold on the second GL waveform, and measuring the second width between the second topo-points.

For instance, in the present example of FIG. 6, a predefined GL threshold (e.g., 70%) is applied on the second waveform 604, and the two topo-points 616 and 618 are identified. The second width 620 between the two points 616 and 618 can be measured, representative of the estimated width 514 as exemplified in FIG. 5.

The lateral recess with respect to the target second layer can be measured based on the first width 610 and the second width 620 (e.g., by subtracting the second width from the first width).

In some embodiments, the measured lateral recess can be further calibrated with respect to reference measurement data of a reference semiconductor specimen obtained from a Transmission Electron Microscope (TEM). Such calibration can improve the accuracy of the measurements. In some cases, the calibration can be performed based on a correlation relationship previously derived between corresponding measurement data from the electron beam tool and the reference measurement data obtained from the TEM.

Figure 3:
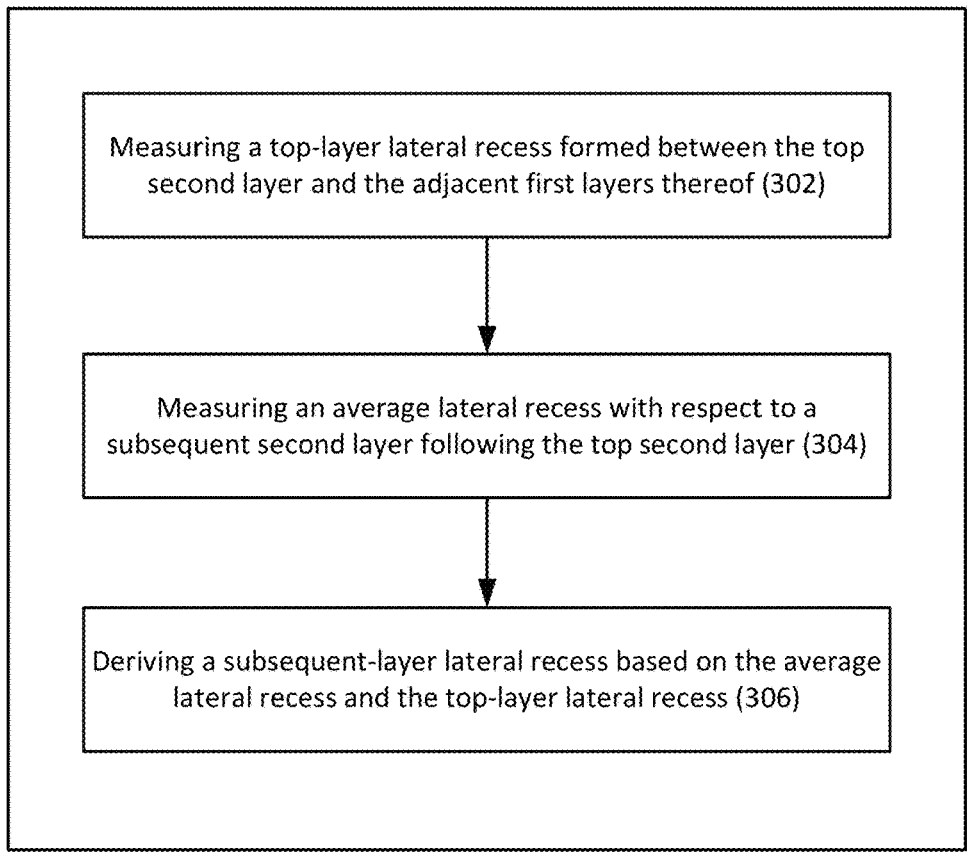
FIG. 3 illustrates a generalized flowchart of measuring a per-layer lateral recess and/or measuring an average lateral recess in accordance with certain embodiments of the presently disclosed subject matter.

Turning now to FIG. 3, there is illustrated a generalized flowchart of measuring a per-layer lateral recess and/or measuring an average lateral recess in accordance with certain embodiments of the presently disclosed subject matter.

As described above, in cases where the target second layer is a top second layer of the one or more second layers, a top-layer lateral recess formed between the top second layer and the adjacent first layers thereof can be measured (302) using the method described above with reference to FIG. 2A. In such cases, the landing energy of the electron beam needs to be specifically selected to penetrate to the depth corresponding to the top second layer. In other words, in such cases, the measured lateral recess as resulted from FIG. 2A refers to the top-layer lateral recess.

Upon the measurement of block 302 being complete, the landing energy of the electron beam can be re-set to be able to penetrate to a depth corresponding to a subsequent second layer following the top second layer (e.g., the middle or bottom second layer as exemplified in FIG. 4), and an average lateral recess with respect to the subsequent second layer can be measured (304). For instance, when the subsequent second layer is the middle second layer, the measured lateral recess refers to an average lateral recess averaged between the top-layer lateral recess and the middle-layer lateral recess. In such cases, a per-layer lateral recess of the subsequent second layer can be derived (306) based on the average lateral recess and the top-layer lateral recess.

According to certain embodiments, the measurement process as described above with reference to FIGS. 2A, 2B and FIG. 3 can be included as part of an examination recipe usable by system 101 and/or the examination tools 120 for examination of a specimen in runtime, such as, e.g., performing metrology operations with respect to the specimen (referred to as a metrology recipe in such cases). Therefore, the presently disclosed subject matter also includes a system and method for generating an examination recipe during a recipe setup phase, where the recipe comprises the steps as described with reference to FIGS. 2A, 2B and FIG. 3 (and various embodiments thereof). It is to be noted that the term "examination recipe" should be expansively construed to cover any recipe that can be used by an examination tool for performing operations related to any kind of examination as described above.

It is to be noted that examples illustrated in the present disclosure, such as, e.g., the exemplified GAA structure, the acquired first and second images, the generated GL waveforms, and the specific ways to estimate widths and/or topo-points as described above, etc., are illustrated for exemplary purposes, and should not be regarded as limiting the present disclosure in any way. Other appropriate examples/implementations can be used in addition to, or in lieu of the above.

It is to be noted that although certain embodiments of the presently disclosed measurement process are described with respect to measuring a lateral recess in a semiconductor specimen that has a specific structure, i.e., the specimen comprises a stack of two types of layers: a first type of one or more first layers, and a second type of one or more second layers deposited alternately on each other, where the second layers are at least partially etched, this is not intended to limit the presently disclosed measurement process to be applied to only such a structured specimen. Alternatively, in some cases, a specimen that comprises only one material and is thus not layered, may have a lateral recess formed on the lateral side thereof, and the presently disclosed measurement process can be similarly applied to such a specimen for the purpose of measuring the lateral recess thereof.

By way of example, the measurement process in such cases can comprise: obtaining a first image acquired by collecting secondary electrons (SE) emitted from the surface of the specimen, and a second image acquired by collecting backscattered electrons (BSE) scattered from an interior region of the specimen between the surface and a target depth (e.g., corresponding to the bottom (or the proximity thereof) of the lateral recess of the specimen), wherein the semiconductor specimen is scanned using an electron beam with a landing energy specifically selected to penetrate to the target depth, and wherein the first image is informative of a surface profile of the specimen, and the second image is informative of the interior structure of the interior region; generating a first gray level (GL) waveform informative of GL intensity distribution of the first image, and a second GL waveform informative of GL intensity distribution of the second image; estimating a first width of the first layers based on the first GL waveform, and a second width with respect to at least the target second layer based on the second GL; and measuring a lateral recess in the specimen based on the first width and the second width.

Among advantages of certain embodiments of the measurement process as described herein is to provide a direct measurement of the lateral recess formed in the above-described semiconductor specimen which is not destructive, yet has improved accuracy and throughput (TpT). This is enabled at least by using the see-through capabilities of the BSE signals in conjunction with the SE signals of the electron beam tool, where the electron beam tool is configured with an electron beam having a relatively high-voltage landing energy.

It is to be understood that the present disclosure is not limited in its application to the details set forth in the description contained herein or illustrated in the drawings.

It will also be understood that the system according to the present disclosure may be, at least partly, implemented on a suitably programmed computer. Likewise, the present disclosure contemplates a computer program being readable by a computer for executing the method of the present disclosure. The present disclosure further contemplates a non-transitory computer-readable memory tangibly embodying a program of instructions executable by the computer for executing the method of the present disclosure.

The present disclosure is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the present disclosure as hereinbefore described without departing from its scope, defined in and by the appended claims.

The invention claimed is:

1. A computerized system of measuring a lateral recess in a semiconductor specimen, the semiconductor specimen comprising a stack of a first type of one or more first layers and a second type of one or more second layers deposited alternately on each other, the second layers being at least partially etched, thereby forming a lateral recess between each given second layer and two first layers adjacent thereto, the system comprising:
an electron beam tool configured to:
scan the semiconductor specimen using an electron beam with a landing energy specifically selected to penetrate to a predefined depth corresponding to a target second layer of the specimen; and
acquire a first image by collecting secondary electrons (SE) emitted from a surface of the specimen, and acquire a second image by collecting backscattered electrons (BSE) scattered from an interior region of the specimen between the surface and the target second layer, the first image informative of a surface profile of the specimen, the second image informative of an interior structure of the interior region; and
a processing and memory circuitry (PMC) operatively connected to the electron beam tool and configured to:
generate a first gray level (GL) waveform informative of GL intensity distribution of the first image, and a second GL waveform informative of GL intensity distribution of the second image;
estimate a first width of the one or more first layers based on the first GL waveform and a second width with respect to at least the target second layer based on the second GL waveform; and
measure a lateral recess with respect to the target second layer based on the first width and the second width.

2. The computerized system according to claim 1, wherein the semiconductor specimen comprises a Gate All Around (GAA) device, and wherein the first layers are made of Silicon, and the second layers are made of silicon germanium.

3. The computerized system according to claim 1, wherein the target second layer is a top second layer of the one or more second layers, and the measured lateral recess is a top-layer lateral recess formed between the top second layer and adjacent first layers thereof.

4. The computerized system according to claim 3, wherein the PMC is further configured to measure an average lateral recess with respect to a subsequent second layer following the top second layer, and derive a subsequent-layer lateral recess based on the average lateral recess and the top-layer lateral recess.

5. The computerized system according to claim 1, wherein the target second layer is a subsequent second layer following a top second layer, and the measured lateral recess is an average lateral recess of a top-layer lateral recess formed between the top second layer and adjacent first layers thereof and a subsequent lateral recess formed between the subsequent second layer and adjacent first layers thereof.

6. The computerized system according to claim 1, wherein the SEs are collected by an array of SE detectors, and the BSEs are collected by at least one BSE detector.

7. The computerized system according to claim 1, wherein the landing energy to penetrate to the predefined depth corresponding to the target second layer is specifically selected based on a comparison between a number of BSEs with respect to a reference specimen with no lateral recess, and a number of BSEs with respect to the semiconductor specimen.

8. The computerized system according to claim 1, wherein the estimating the first width comprises estimating first topo-points on the first GL waveform by calculating derivatives along the first GL waveform, applying a predefined derivative threshold on the first GL waveform, giving rise to the first topo-points, and measuring the first width between the first topo-points.

9. The computerized system according to claim 1, wherein the estimating the second width comprises estimating second topo-points on the second GL waveform by applying a predefined GL threshold on the second GL waveform, giving rise to the second topo-points, and measuring the second width between the second topo-points.

10. The computerized system according to claim 1, wherein the PMC is further configured to calibrate the measured lateral recess with respect to reference measurement data obtained from a Transmission Electron Microscope (TEM).

11. The computerized system according to claim 10, wherein the calibration is based on a correlation relationship previously derived between corresponding measurement data from the electron beam tool and the reference measurement data obtained from the TEM.

12. A computerized method of measuring a lateral recess in a semiconductor specimen, the semiconductor specimen comprising a stack of a first type of one or more first layers and a second type of one or more second layers deposited alternately on each other, the second layers being at least partially etched, thereby forming a lateral recess between each given second layer and two first layers adjacent thereto, the method performed by a processing and memory circuitry (PMC) and comprising:
  obtaining a first image acquired by collecting secondary electrons (SE) emitted from a surface of the specimen, and a second image acquired by collecting backscattered electrons (BSE) scattered from an interior region of the specimen between the surface and a target second layer, wherein the semiconductor specimen is scanned using an electron beam with a landing energy specifically selected to penetrate to a predefined depth corresponding to the target second layer, and wherein the first image is informative of a surface profile of the specimen, and the second image is informative of an interior structure of the interior region;
  generating a first gray level (GL) waveform informative of GL intensity distribution of the first image, and a second GL waveform informative of GL intensity distribution of the second image;
  estimating a first width of the first layers based on the first GL waveform and a second width with respect to at least the target second layer based on the second GL; and
  measuring a lateral recess with respect to the target second layer based on the first width and the second width.

13. The computerized method according to claim 12, wherein the target second layer is a top second layer of the one or more second layers, and the measured lateral recess is a top-layer lateral recess formed between the top second layer and adjacent first layers thereof.

14. The computerized method according to claim 13, further comprising measuring an average lateral recess with respect to a subsequent second layer following the top second layer, and deriving a subsequent-layer lateral recess based on the average lateral recess and the top-layer lateral recess.

15. The computerized method according to claim 12, wherein the target second layer is a subsequent second layer following a top second layer, and the measured lateral recess is an average lateral recess of a top-layer lateral recess formed between the top second layer and adjacent first layers thereof and a subsequent lateral recess formed between the subsequent second layer and adjacent first layers thereof.

16. The computerized method according to claim 12, wherein the landing energy to penetrate to the predefined depth corresponding to the target second layer, is specifically selected based on a comparison between a number of BSEs with respect to a reference specimen with no lateral recess, and a number of BSEs with respect to the semiconductor specimen.

17. The computerized method according to claim 12, wherein the estimating the first width comprises estimating first topo-points on the first GL waveform by calculating derivatives along the first GL waveform, applying a predefined derivative threshold on the first GL waveform, giving rise to the first topo-points, and measuring the first width between the first topo-points.

18. The computerized method according to claim 12, wherein the estimating the second width comprises estimating second topo-points on the second GL waveform by applying a predefined GL threshold on the second GL waveform, giving rise to the second topo-points, and measuring the second width between the second topo-points.

19. The computerized method according to claim 12, further comprising calibrating the measured lateral recess with respect to reference measurement data obtained from a Transmission Electron Microscope (TEM).

20. A non-transitory computer readable storage medium tangibly embodying a program of instructions that, when executed by a computer, cause the computer to perform a method of measuring a lateral recess in a semiconductor specimen, the semiconductor specimen comprising a stack of a first type of one or more first layers, and a second type of one or more second layers deposited alternately on each other, the second layers being at least partially etched, thereby forming a lateral recess between each given second layer and two first layers adjacent thereto, the method comprising:
  obtaining a first image acquired by collecting secondary electrons (SE) emitted from a surface of the specimen, and a second image acquired by collecting backscattered electrons (BSE) scattered from an interior region of the specimen between the surface and a target second layer, wherein the semiconductor specimen is scanned using an electron beam with a landing energy specifically selected to penetrate to a predefined depth corresponding to the target second layer, and wherein the first image is informative of a surface profile of the specimen, and the second image is informative of an interior structure of the interior region;
  generating a first gray level (GL) waveform informative of GL intensity distribution of the first image, and a second GL waveform informative of GL intensity distribution of the second image;
  estimating a first width of the first layers based on the first GL waveform and a second width with respect to at least the target second layer based on the second GL; and
  measuring a lateral recess with respect to the target second layer based on the first width and the second width.

* * * * *